(12) United States Patent
Friel et al.

(10) Patent No.: US 9,017,633 B2
(45) Date of Patent: Apr. 28, 2015

(54) CVD SINGLE CRYSTAL DIAMOND MATERIAL

(75) Inventors: Ian Friel, Guildford (GB); Sarah Louise Geoghegan, Byfleet (GB); Daniel James Twitchen, Bracknell (GB); Joseph Michael Dodson, Winkfield (GB)

(73) Assignee: Element Six Technologies Limited (GB)

( * ) Notice: Subject to any disclaimer, the term of this patent is extended or adjusted under 35 U.S.C. 154(b) by 532 days.

(21) Appl. No.: 13/006,682

(22) Filed: Jan. 14, 2011

(65) Prior Publication Data

US 2011/0176563 A1    Jul. 21, 2011

Related U.S. Application Data

(60) Provisional application No. 61/295,893, filed on Jan. 18, 2010.

(51) Int. Cl.
| | | |
|---|---|---|
| B01J 3/06 | (2006.01) | |
| C03B 23/00 | (2006.01) | |
| C03B 25/00 | (2006.01) | |
| C30B 28/12 | (2006.01) | |
| C30B 28/14 | (2006.01) | |
| C30B 28/06 | (2006.01) | |
| B32B 7/02 | (2006.01) | |
| G11B 11/105 | (2006.01) | |
| B32B 9/00 | (2006.01) | |
| B32B 5/16 | (2006.01) | |
| C30B 29/04 | (2006.01) | |
| C30B 25/02 | (2006.01) | |
| H01S 3/094 | (2006.01) | |
| H01S 3/16 | (2006.01) | |
| H01S 3/30 | (2006.01) | |

(52) U.S. Cl.
CPC ........... *C30B 29/04* (2013.01); *C30B 25/02* (2013.01); *H01S 3/094* (2013.01); *H01S 3/163* (2013.01); *H01S 3/30* (2013.01)

(58) Field of Classification Search
None
See application file for complete search history.

(56) References Cited

U.S. PATENT DOCUMENTS

| 6,096,129 A | 8/2000 | Saito et al. |
| 6,582,513 B1 | 6/2003 | Linares et al. |

(Continued)

FOREIGN PATENT DOCUMENTS

| EP | 1 290 251 B1 | 3/2003 |
| EP | 1 292 726 B1 | 3/2003 |

(Continued)

OTHER PUBLICATIONS

PCT Search Report for PCT/EP2011/050477 dated Apr. 6, 2011.

(Continued)

*Primary Examiner* — Guinever Gregorio
(74) *Attorney, Agent, or Firm* — Bryan Cave LLP (57) ABSTRACT

Single crystal diamond material produced using chemical vapour deposition (CVD), and particularly diamond material having properties suitable for use in optical applications such as lasers, is disclosed. In particular, a CVD single crystal diamond material having preferred characteristics of longest linear internal dimension, birefringence and absorption coefficient, when measured at room temperature, is disclosed. Uses of the diamond material, including in a Raman laser, and methods of producing the diamond are also disclosed.

25 Claims, 2 Drawing Sheets

(56) References Cited

U.S. PATENT DOCUMENTS

| | | | |
|---|---|---|---|
| 7,740,824 B2* | 6/2010 | Godfried et al. | 423/446 |
| 2005/0163169 A1 | 7/2005 | Lawandy et al. | |
| 2007/0036921 A1 | 2/2007 | Twitchen et al. | |
| 2007/0054124 A1* | 3/2007 | Gill et al. | 428/408 |
| 2008/0085233 A1* | 4/2008 | Scarsbrook et al. | 423/446 |
| 2011/0176563 A1* | 7/2011 | Friel et al. | 372/3 |
| 2011/0271900 A1* | 11/2011 | Spits et al. | 117/79 |

FOREIGN PATENT DOCUMENTS

| | | |
|---|---|---|
| JP | 2008-179505 | 7/2008 |
| WO | 01/96634 A1 | 12/2001 |
| WO | 2004/046427 A1 | 6/2004 |
| WO | 2006/136929 A2 | 12/2006 |
| WO | 2007/066215 A2 | 6/2007 |

OTHER PUBLICATIONS

Friel, I. et al., "Control of surface and bulk crystalline quality in single crystal diamond grown by chemical vapour deposition", Diamond & Related Materials, 2009, 18:808-815.

Gaukroger, M.P. et al., "X-ray topography studies of dislocations in single crystal CVD diamond", Diamond & Related Materials, 2008, 17(3):262-269.

Glazer, A.M. et al., "An automatic optical imaging system for birefringent media", Proc. R. Soc. Lond. A., 1996, 452:2751-2765.

Howarth, D.F. et al., "Generalization of the lineshape useful in magnetic resonance spectroscopy", J. Magn. Res., 2003, 161:215-221.

Hyde, J.S. et al., "Pseudo Field Modulation in EPR Spectroscopy", Appl. Magn. Reson., 1990, 1:483-496.

ISO Standard 11146, "Lasers and laser-related equipment—Test methods for laser beam widths, divergence angles and beam propagation ratios" (2005).

Lawson, S.C. et al., "On the existence of positively charged single-substitutional nitrogen in diamond", J. Phys. Condens. Matter, 1998, 10:6171-6180.

Mildren, R.P. et al., "CVD-diamond external cavity Raman laser at 573 nm", Optics Express, 2008, 16 (23):18950-18955.

Mildren, R.P. et al., "Highly efficient diamond Raman laser", Optics Letters, 2009, 34(18):2811-2813.

Nelder, J.A. et al., "A simplex method for function minimization", The Computer Journal, 1965, 7:308-313.

Saleh et al., Fundamentals of Photonics, Wiley 1991, Ch. 3.

Silva, F. et al., "High quality, large surface area, homoepitaxial MPACVD diamond growth", Diamond & Related Materials, 2009, 18:683-697.

Twitchen, D.J. et al., "Thermal conductivity measurements on CVD diamond", Diamond & Related Materials, 2001, 10:731-735.

Waldermann, F.C. et al., "Measuring phonon dephasing with ultrafast pulses using Raman spectral interference", Phys. Rev. B, 2008, 78:155201.

* cited by examiner

CVD SINGLE CRYSTAL DIAMOND MATERIAL

The present application claims the benefit of U.S. Provisional Application Ser. No. 61/295,893, filed Jan. 18, 2010, which is hereby incorporated by reference herein in its entirety

FIELD OF THE INVENTION

This invention relates to single crystal diamond material produced using chemical vapour deposition (CVD), and in particular to diamond material having properties suitable for use in optical applications such as lasers.

BACKGROUND OF THE INVENTION

Chemical vapour deposition (CVD) is an established technique for depositing material onto a substrate. The technique has been extensively described in patent and other literature. For deposition of diamond, the CVD process typically involves providing a gas mixture that, on dissociation, can provide carbon and hydrogen. The dissociation of the source gas mixture is brought about by an energy source, such as microwaves, radio frequency energy, a flame, a hot filament or jet based technique. The reactive species are allowed to deposit onto a suitable substrate, typically held at between 700° C. and 1200° C., to form diamond.

The minimisation of the presence of defects within CVD diamond is of utmost importance for several applications. There are different types of defects that occur in CVD diamond. Point defects can occur when impurities in the growth atmosphere are incorporated into the diamond lattice. Another type of defect is a dislocation. Dislocations form within the crystal, possibly due to the formation of pits on the diamond growth surface, and can further multiply during growth. Such pits may also be responsible for the inclusion of other defects and impurities.

The increasing presence of these defects is detrimental to several properties of the CVD diamond material. An increasing presence of all types of defects affects certain properties, for example, decreasing the thermal conductivity (as phonons are scattered). The point defects also affect absorption of photons and are therefore deleterious to optical transparency. Dislocations result in local birefringence due to their anisotropic disruption of the cubic symmetry of the lattice and so are also detrimental to the optical properties of the diamond material.

It has been found that dislocations in homoepitaxial CVD diamond layers tend to nucleate at or near the interface with their substrate. It has also been found that dislocations generally have line directions that are close to perpendicular to the local growth surface and that, as a result, the strain-related birefringence shows a characteristic anisotropy, being much more obvious for a viewing direction parallel to the growth direction.

WO2004/046427 A1 describes the production of "optical quality diamond material" via the CVD process by utilising a controlled, low level of nitrogen to control the development of the crystal defects. It is described how nitrogen present in the CVD diamond material must be sufficient to prevent or reduce local strain generating defects whilst being low enough to prevent or reduce deleterious absorptions and crystal quality degradation.

U.S. Pat. No. 6,096,129 describes a method of growing diamond material on a substrate surface such that the grown diamond material has a larger area than the starting substrate. The reference describes providing an initial single crystalline diamond base material, onto which single crystalline diamond material is homoepitaxially vapour deposited to provide a resulting diamond material that is cut and polished to provide a successive base material onto which single crystalline material is again grown, thereby forming a single crystalline diamond material having a large area. As best exemplified in FIGS. 4A-4C of U.S. Pat. No. 6,096,129, the initial base material is substantially square with {100} side surfaces, growth taking place predominantly on an upper {001} surface, that growth taking place laterally as well as normally from the upper {001} surface so that the grown surface has enlarged lateral dimensions compared to those of the initial base material. The successive base material that is cut from the grown diamond material is square in cross-section. The sides of the square are rotated 45° relative to the sides of the initial base material, and have <110> edges. The area of the square cross section of the successive base material is less than twice the area of the square cross-sectional area of the initial base material, due to the encroachment of {111} faces in the grown diamond material. This successive base material is then used for further growth, this further growth being from the <110> edges. The preferred growth rate ratio α is said to be at least 3:1.

The growth rate ratio, α, is a parameter that can be monitored in a CVD single crystal diamond material process, and is well understood in the art of diamond material synthesis by CVD. The parameter α is proportional to the ratio of the growth rate (GR) in the <001> direction ($R_{<001>}$) to the growth rate in the <111> direction ($R_{<111>}$), and is defined as:

$$\alpha = \frac{\sqrt{3} \times R_{<001>}}{R_{<111>}}.$$

In known CVD processes the α parameter is known to vary, typically over the range 1 to 3, the value of α depending, inter alia, on the set of synthesis conditions in place, including the pressure, the temperature and the gas flow conditions. The parameter α can be calculated after synthesis has been completed by making measurements on the as-grown diamond materials and using simple geometric relationships and crystallography to calculate α. It is also known in the art to make an 'α parameter map' of a particular synthesis process by measuring diamond materials grown under a range of pressure, temperature and gas composition combinations—again by post facto measurements. The methodology of characterising the α parameter for a given set of conditions is reported widely, however a particularly useful reference is Silva et al., Diamond & Related Materials (2009), doi:10.1016/j.diamond.2009.01.038. Silva et al describes how to select the temperature, gas pressure, power, and the process chemistry (e.g. the amount of methane, oxygen, nitrogen, hydrogen and argon gas etc) in order to achieve predetermined values of the α parameter. The exact values of each of these properties are specific to the process used by Silva, but the skilled man can readily characterise any other process, and select appropriate values for each of the above properties using the teaching of Silva et al in order to achieve the desired α parameter.

Single crystal diamond finds a potential application within Raman lasers, as described in US 2005/0163169. Such an application places severe requirements on the diamond material that can be utilised.

Raman lasers rely on the process of Raman scattering. Spontaneous Raman scattering occurs when a photon incident on a material results in the excitation of a vibrational mode from its initial energy level to an excited, virtual state. This virtual state can then return to an energy level different to the original level, producing a photon of different energy (and frequency) to that of the incident photon. For the majority of the spontaneously Raman scattered photons the final energy level is higher than the initial level, the scattered photon therefore has a lower energy than the incident photon, this is termed Stokes scattering. The energy difference between the incident and scattered photons results in the production of a phonon (a quantised lattice vibration).

In a Raman laser the scattered photon is utilised to stimulate further Raman scattered photons of the same wavelength: stimulated Raman scattering (SRS). This is achieved by feeding the scattered photon back into the Raman scattering medium, commonly by keeping the Raman scattering medium within an appropriate optical resonator, as described in Optics Express, 2008 16 (23), pages 18950-18955 and Optics Letters, 2009 34, pages 2811-2813.

In spontaneous Raman scattering it is also possible to observe second Stokes photons due to the Raman scattering of the first Stokes photon. This process can be repeated further such that a succession of higher order Stokes photons are observed with frequencies equal to the pump photon frequency minus an integer number of the characteristic phonon frequency. In a Raman laser, these higher order Stokes wavelengths can in principle be engineered to be the main emission wavelength of the device by simply designing the optical cavity to resonate at the desired Stokes wavelength.

The Raman laser is therefore capable of changing the frequency of the input light, advantageously producing an output beam with a frequency in a part of the electromagnetic spectrum that was previously unattainable with conventional laser technology.

Single crystal diamond is a promising material for use as the Raman scattering medium within the Raman laser. It has a high Raman gain coefficient, possesses low absorbance in a wide range of the electromagnetic spectrum (allowing versatility in the choice of input, intermediate and output frequencies), it is a good dissipater of thermal energy which is generated in the form of phonons as an integral part of the process, and possesses a low thermal expansion coefficient (minimising temperature related distortions).

The Raman gain coefficient, $g_R$, is defined as $$g_R = const \times \frac{T_2}{\lambda_S}$$

where $T_2$ is the optical phonon decoherence time, $\lambda_S$ is the Stokes-shifted output wavelength and const is a material dependent constant of proportionality.

There are several considerations when optimising diamond material for use as the Raman scattering medium in a Raman laser. Point defects must be minimised in order to minimise absorption (and so potential efficiency reduction). Dislocations must be minimised in order to minimise birefringence (and so minimise detrimental effects when the material is utilised in polarisation sensitive applications). All defects must be low to maintain a high thermal conductivity so that the Raman scattering medium is able to handle high input powers while minimising temperature related distortion of the material. The material must also have a long internal path length for the incident light as this reduces the threshold of the laser device (the minimum input power required for the device to act as a laser).

In addition to the crystalline quality of the Raman scattering medium, the polarisation of the pump beam with respect to the symmetry axes of the crystal is another parameter which affects the Raman gain coefficient. For a linearly polarised pump beam with polarisation vector along a <110> direction, the Stokes beam is polarised parallel to the pump beam. For a pump beam polarised along a <100> direction the Stokes beam is polarised perpendicular to the pump beam. This suggests a particularly convenient crystallographic configuration of the diamond gain crystal, in which a rectangular block with two pairs of {110} faces and one pair of {100} faces is manufactured. By pumping the diamond Raman scattering medium crystal through a {110} face at the Brewster angle with p-polarised light, reflections at the incident and exit faces are eliminated for both the pump and Stokes beams. An even better configuration entails processing Brewster facets on the incident/exit faces, such that the pump beam within the crystal proceeds along the <110> direction. This then ensures that there is no component of the pump beam direction perpendicular to the length of the cavity and so there is also no risk of the pump beam exiting one side of the crystal and that the pump beam lies accurately on the <110> direction.

By engineering the diamond in such a way as to accommodate Brewster angle pumping, the requirement for anti-reflection coatings, which add cost and complication, is avoided.

Figure 1:
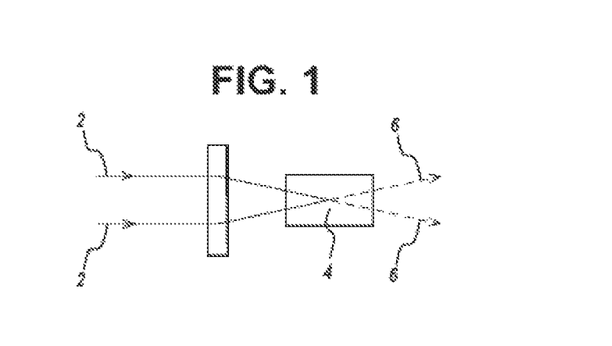
FIG. 1 schematically depicts a Raman laser in the Raman generator configuration.
Figure 2:
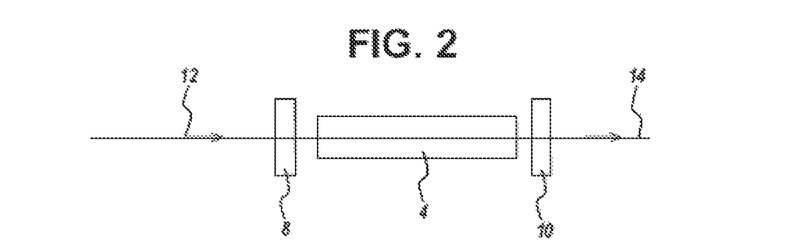
FIG. 2 schematically depicts a Raman laser in the external Raman resonator configuration.

Diamond Raman lasers can operate in a number of configurations. The most simple is as a Raman generator, in which a high intensity pulsed pump laser 2 is focused onto the diamond Raman gain crystal 4, resulting in conversion of the pump wavelength to multiple Stokes orders which constitute the output beam 6 of the laser (FIG. 1). Although this is a relatively simple design which does not require an optical cavity, in practice such a configuration is of little use due to the limited control of the output spectrum A second type of configuration is as an external Raman resonator. Here the Raman crystal 4 is placed within an optical resonator comprising an input mirror 8 and an output mirror 10 in order to reduce the SRS threshold, increase the conversion efficiency and tailor the output wavelength 14 (FIG. 2). In this configuration the cavity is pumped externally with either a continuous wave (cw) or pulsed laser source 12. Due to diamond's high Raman gain coefficient the Raman crystal can be kept short compared to other Raman gain materials. Such an external diamond Raman resonator can therefore be viewed as a simple, compact add-on enabling frequency conversion for a wide variety of laser sources.

Figure 3:
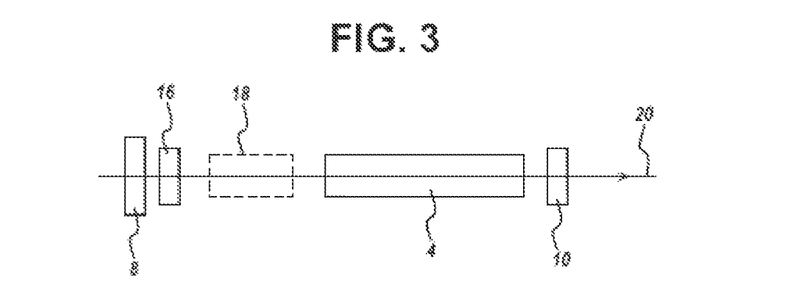
FIG. 3 schematically depicts a Raman laser in the intracavity Raman resonator configuration.

A third configuration is an intracavity Raman resonator, in which both the pump laser medium 16 and the Raman crystal 4 are placed within a cavity, comprising input mirror 8 and output mirror 10, resonant at both pump and Stokes wavelengths (FIG. 3). This configuration takes advantage of the high intracavity pump field which leads to enhanced conversion to the output beam 20. The cavity may also include other optical elements such as a Q-switch 18 for pulsed mode operation.

There is therefore a need to produce a diamond material with fewer point defects and fewer dislocations while maintaining a long internal dimension.

SUMMARY OF THE INVENTION

Among the various aspects of the invention may be noted is the provision of a single crystal CVD diamond material with a decreased point defect density, decreased dislocation density and an increased internal dimension, suitable for demanding applications such as the Raman scattering medium within a Raman laser. Further, a method for producing such a single crystal diamond is required.

The invention relates to a CVD single crystal diamond material wherein the diamond material has the following characteristics, when measured at room temperature:
- a longest linear internal dimension greater than 7 mm,
- a birefringence of below $1 \times 10^{-5}$ determined using a light beam with cross-sectional area greater than 0.01 mm$^2$ and along an internal path greater than 7 mm and
- an absorption coefficient below 0.010 cm$^{-1}$ determined at a wavelength of 1064 nm.

The term "room temperature" defines the temperature between 20° C. and 25° C., more specifically 20° C.

The CVD single crystal diamond material may have a longest linear internal dimension greater than 7 mm, preferably greater than 7.5 mm, preferably greater than 8 mm, preferably greater than 10 mm, preferably greater than 12 mm, preferably greater than 15 mm, preferably greater than 18 mm, preferably greater than 20 mm, preferably greater than 25 mm. The increased length of the CVD single crystal diamond is of use in several applications, namely as the Raman scattering medium within a Raman laser, wherein the increased length leads to a reduced lasing threshold. The Raman scattering medium is the material within the Raman laser within which stimulated Raman scattering is induced.

The term "longest linear internal dimension" relates to the longest straight line distance that lies completely within the body of the CVD single crystal diamond material, for example, the body diagonal of a cube.

The CVD single crystal diamond material further exhibits a birefringence of below $1 \times 10^{-5}$, preferably below $3 \times 10^{-6}$, preferably below $1 \times 10^{-6}$, preferably below $3 \times 10^{-7}$, preferably below $1 \times 10^{-7}$. This birefringence may be determined over an area greater than 0.01 mm$^2$, an area greater than 0.1 mm$^2$, an area greater than 1 mm$^2$, an area greater than 5 mm$^2$, or an area greater than 25 mm$^2$; and over a path length of at least 7 mm, preferably at least 7.5 mm, preferably at least 8 mm, preferably at least 10 mm, preferably at least 12 mm, preferably at least 15 mm, preferably at least 18 mm, preferably at least 20 mm, preferably at least 25 mm. This decreased birefringence results in a decrease in depolarisation of any light passing within the CVD single crystal diamond material, and so a decrease in depolarisation losses.

"Depolarisation losses" refers to optical energy losses due to unintended changes in the polarisation of the pump or Stokes beam caused by excessively high birefringence in the diamond. An example of such a loss is the specific case in which the diamond Raman gain medium is pumped at the Brewster angle such that the pump and Stokes beams are both p-polarised. Any birefringence in the diamond will cause a rotation of the polarisation of both beams such that a fraction of the beams will be reflected at the crystal boundaries and subsequently lost from the optical cavity.

Birefringence can be determined by a technique outlined by Glazer et al. Proc. R. Soc. Lond. A Dec. 8, 1996 452:2751-2765. A commercial system which implements this technique is available, called Metripol. Metripol measures the sine of the phase retardation $\delta$ between two orthogonally polarised beams of a sample exhibiting birefringence, where $\delta = 2\pi(\Delta n) d/\lambda$, and d is the sample thickness, $\lambda$ is the wavelength of light used for the measurement, here 550 nm. As $\lambda$ and d are known, this allows $\Delta n$ to be calculated. Since Metripol measures $\delta$ along the entire length of the sample in a given direction, this calculated $\Delta n$ represents an average value of birefringence along the direction of measurement and over an area that is the cross-sectional area of the measurement beam.

In this work it is understood that the $\Delta n$ measured is the average value along the direction of measurement at a wavelength of 550 nm by the Metripol instrument.

The CVD single crystal diamond also exhibits an absorption coefficient of below 0.010 cm$^{-1}$, preferably below 0.007 cm$^{-1}$, preferably below 0.005 cm$^{-1}$, preferably below 0.003 cm$^{-1}$, preferably below 0.001 cm$^{-1}$; determined for light at a wavelength of 1064 nm. A decreasing absorption coefficient will decrease losses for light passing within the CVD single crystal diamond material, resulting in a high optical transparency. Such a high optical transparency results in low absorption losses when the CVD single crystal diamond material is used as the Raman scattering medium in Raman laser applications. Fundamentally, the absorption coefficient that is most important is the absorption coefficient measured along the beam path used in the application in which the material is used. In practice, the absorption coefficient is more generally measured along the beam path used by the measurement instrument. In practice the absorption coefficient may be measured over substantially the whole material.

The absorption coefficient is measured by using laser calorimetry, with a thermocouple attached to the sample under test to measure the rise in temperature resulting from the passage of the laser beam of the required wavelength.

The CVD single crystal diamond material may further include a longest linear optically accessible dimension of greater than 7 mm, preferably greater than 7.5 mm, preferably greater than 8 mm, preferably greater than 10 mm, preferably greater than 12 mm, preferably greater than 15 mm, preferably greater than 18 mm, preferably greater than 20 mm, preferably greater than 25 mm. An increased optically accessible dimension is of use for optical applications, such as the Raman scattering medium of a Raman laser. The increased optically accessible dimension reduces the lasing threshold of the Raman laser.

The "longest linear optically accessible dimension" refers to the longest straight line distance within the body of the CVD single crystal diamond material along which light can travel when entering at one surface and exiting at another when the diamond material is surrounded by air with a refractive index n=1. For a light beam to exit the CVD single crystal diamond material it must be incident on an internal surface of the CVD single crystal diamond material at an angle that is less than the critical angle measured relative to the surface normal. If the angle is greater than the critical angle the light beam will not exit the CVD single crystal diamond material and will undergo total internal reflection. Therefore, the longest linear optically accessible dimension of the CVD single crystal diamond material is the longest straight line that extends within the CVD single crystal diamond material between two faces of the material, wherein the line is incident on each of two opposing surfaces at an angle which is at or less than the critical angle when measured relative to the direction normal to that surface.

The critical angle is dependent on the refractive indices of the material either side of the interface upon which the light is incident. For example, for an air-diamond interface light travelling from diamond into air would have to be incident at an angle greater than approximately 24.4° measured relative to the surface normal in order to be totally internally reflected. This critical angle is purely illustrative as refractive indices are dependent on the wavelength of light being used.

The CVD single crystal diamond material may further exhibit an optical phonon decoherence time, $T_2$, when measured at room temperature, determined to be greater than 4 ps, preferably greater than 6 ps, preferably greater than 8 ps preferably greater than 10 ps, preferably greater than 15 ps. $T_2$ is proportional to the Raman gain coefficient and so increasing $T_2$ will result in an increase in the performance of the CVD single crystal diamond material in a Raman laser application, as a greater output power will result from a given input power.

The equation showing this proportionality between the Raman gain coefficient, $g_R$, and $T_2$ is $$g_R = const \times \frac{T_2}{\lambda_S}$$

where $T_2$ is the optical phonon decoherence time, $\lambda_S$ is the Stokes-shifted output wavelength and const is a material dependent constant of proportionality.

The term "input power" refers to the power of the pumping light beam incident on the Raman scattering medium. The pumping light beam is the light beam utilised to cause Raman scattering within the Raman scattering medium. The term "output power" refers to the power of the stimulated Raman scattered beam emitted from the Raman scattering medium.

The optical phonon decoherence time is the lifetime of the optical phonon produced during Stokes Raman scattering. The upper limit of $T_2$ is set by the subsequent decay of the optical phonon into two acoustic phonons. However, the inventors have realised that $T_2$ within diamond containing defects is reduced relative to this upper limit, due to scattering of the optical phonons off the defects. These defects must be reduced to increase $T_2$ and achieve a greater Raman gain coefficient. Such defects include isotopic impurities (including $C^{13}$), point defects, defect complexes, extended defects such as dislocations and other sources of strain.

$T_2$ can be inferred from the first order Raman line width, as determined from a measurement of the Raman spectrum of the material. However, for high quality single crystal diamond (resulting in a long $T_2$ and hence narrow Raman line width), such measurements can be limited by spectrometer resolution and the line width of the excitation source. An alternative technique which accurately measures $T_2$ directly is that of Transient Coherent Ultra-fast Phonon Spectroscopy (TCUPS), described in Waldermann et al. Phys. Rev. B 78 155201 (2008). This technique involves the excitation of the Raman active medium by a pair of consecutive coherent pulses, in which the pulse lengths are short compared to $T_2$. The first pulse Raman scatters off the crystal, creating a Stokes photon and an optical phonon. The second pulse repeats the process. The two Stokes pulses will be phase coherent if they are separated by a time less than $T_2$ for the optical phonon. This can be detected as interference fringes in a spectrometer. Thus, by measuring the amplitude decay of the interference fringes between the two Stokes pulses as a function of the pulse separation, $T_2$ can be inferred.

The CVD single crystal diamond material may also contain a content of single-substitutional nitrogen in the neutral charge state within the CVD single crystal diamond material, measured by EPR, of less than or equal to $5 \times 10^{15}$ atoms $cm^{-3}$, preferably below $1 \times 10^{15}$ atoms $cm^{-3}$, preferably below $5 \times 10^{14}$ atoms $cm^{-3}$. The decreasing nitrogen content results in a lower point defect concentration within the CVD single crystal diamond material. This advantageously reduces the absorption coefficient and increases $T_2$, decreasing the losses and increasing the Raman gain coefficient respectively.

The single-substitutional nitrogen in the neutral charge state content is measured by using electron paramagnetic resonance (EPR). Whilst the method is well-known in the art, for completeness, it is summarised here. In measurements conducted using EPR, the abundance of a particular paramagnetic defect (e.g. the neutral single-substitutional nitrogen defect) is proportional to the integrated intensity of all the EPR absorption resonance lines originating from that centre. This permits the concentration of the defect to be determined by comparing the integrated intensity to that which is observed from a reference sample, provided care is taken to prevent or correct for the effects of microwave power saturation. Since continuous wave EPR spectra are recorded using field modulation, double integration is required to determine the EPR intensity and hence the defect concentration. To minimise the errors associated with double integration, base line correction, finite knits of integration, etc., especially in cases where overlapping EPR spectra are present, a spectral fitting method (using a Nelder-Mead simplex algorithm (J. A. Nelder and R. Mead, The Computer Journal, 7 (1965), 308)) is employed to determine the integrated intensity of the EPR centres present in the sample of interest. This entails fitting the experimental spectra with simulated spectra of the defects present in the sample and determining the integrated intensity of each from the simulation. Experimentally it is observed that neither a Lorentzian nor Gaussian line shape provides a good fit to the experimental EPR spectra, therefore a Tsallis function is used to produce the simulated spectra (D. F. Howarth, J. A. Weil, Z. Zimpel, J. Magn. Res., 161 (2003), 215). Furthermore, in the case of low nitrogen concentrations, it is often necessary to use modulation amplitudes approaching or exceeding the line width of the EPR signals to achieve a good signal/noise ratio (enabling accurate concentration determination within a reasonable time frame). Hence pseudo-modulation is employed, with the Tsallis line shape in order to produce a good fit to the recorded EPR spectra (J. S. Hyde, M. Pasenkiewicz-Gierula, A. Jesmanowicz, W. E. Antholine, Appl. Magn. Reson., 1 (1990), 483). Using this method the concentration can be determined with a reproducibility of better than ±5%.

The concentration of single-substitutional nitrogen in the neutral charge state present in the synthetic CVD single crystal diamond material of the present invention may also be measured using the 270 nm peak using UV-visible absorption spectroscopy. The technique of UV-visible absorption spectroscopy is well-known in the art.

The concentration of single-substitutional nitrogen in the neutral charge state in the synthetic CVD single crystal diamond material may be found by measuring infrared absorption peaks at wavenumbers of 1332 $cm^{-1}$ and 1344 $cm^{-1}$. Using a spectrometer with a resolution of 1 $cm^{-1}$, the conversion factors between the absorption coefficient values in $cm^{-1}$ for the peaks at 1332 $cm^{-1}$ and 1344 $cm^{-1}$ and the concentrations of single nitrogen in the positively-charged and neutral states respectively are 5.5 (S. C. Lawson et al., J. Phys. Condens. Matter, 10 (1998), 6171-6181) and 44. However, it must be noted that the value derived from the 1332 $cm^{-1}$ peak is only an upper limit.

Alternatively, the total concentration of nitrogen may be determined using secondary ion mass spectroscopy (SIMS). SIMS has a lower detection limit for nitrogen in diamond of approximately 0.1 ppm and its use is well-known in the art. For synthetic diamond produced by a CVD method, the vast majority of nitrogen present in the solid is in the form of neutral single substitutional nitrogen, and therefore, whilst SIMS measurements of the total nitrogen concentration inevitably provide an upper limit to the concentration of single-substitutional nitrogen in the neutral charge state, they typically also provide a reasonable estimate of its actual concentration.

The CVD single crystal diamond material may further contain a dislocation density less than $10^4$ dislocations $cm^{-2}$, preferably less than $3 \times 10^3$ dislocations $cm^{-2}$, preferably less than $10^3$ dislocations $cm^{-2}$, preferably less than $10^2$ dislocations $cm^{-2}$, preferably less than 10 dislocations $cm^{-2}$. The decreased dislocation density results in the diamond material exhibiting a lower birefringence. A reduced birefringence is advantageous as it results in reduced depolarisation losses.

The dislocation density is measured by assessing the number of dislocations in a given volume sampled by x-ray topography using the method described in "X-ray topography studies of dislocations in single crystal CVD diamond", Gaukroger et al., Diamond and Related Materials, Volume 17, Issue 3, March 2008, Pages 262-269. X-ray topographs are recorded using a Lang camera fitted to a rotating anode X-ray generator. To provide information about the dislocations throughout a sample, projection topographs are recorded by translating the sample through the beam in order to expose its complete volume.

For Burgers vector analysis, projection topographs are recorded for four different <111> reflections. Dislocations in diamond generally have <110> Burgers vector. The six different <110> directions are given by the lines along which two different {111} planes intersect. To a good approximation, a dislocation is invisible in a given X-ray topograph if its Burgers vector lies parallel to the atomic layers responsible for diffraction. This means that for a set of four topographs, each generated using a different <111> reflection, a given dislocation with a <110> Burgers vector should be present in two topographs but absent from the other two topographs, with the Burgers vector given by the line of intersection of the diffracting planes for the latter two topographs.

A computer programme is then used to identify the pairs of coordinates corresponding to the points where individual lines break the upper and lower surfaces of the sample. In this way lists of line positions and contrast strength can be built up for each of the recorded topographs. Matching of coordinate pairs in different topographs within a set tolerance is taken as an indication that the same line had been imaged. Comparing these four images gives an indication of the total number of dislocations in the sampled volume.

The CVD single crystal diamond material may further exhibit a thermal conductivity, measured at room temperature, greater than 2000 $Wm^{-1}K^{-1}$, preferably greater than 2100 $Wm^{-1}K^{-1}$, preferably greater than 2300 $Wm^{-1}K^{-1}$, preferably greater than 2500 $Wm^{-1}K^{-1}$. An increasing thermal conductivity advantageously reduces temperature-related distortions of the CVD single crystal diamond material. Such distortions can be detrimental to the optical properties of the CVD single crystal diamond material, increasing thermal lensing for example. When the CVD single crystal diamond material is used as the Raman scattering medium in a Raman laser, an increase in thermal lensing would distort the beam. A higher thermal conductivity would allow the Raman laser to operate at higher input powers without suffering these detrimental distortions.

Thermal conductivity is measured by the laser flash technique, as described by Twitchen et al. Diamond and Related Materials, 10 (2001) 731. For the laser flash technique the diamond under test is mounted in a cryostat to ensure the temperature of the sample is known precisely. A short, high energy laser pulse (approximately 8 ns in duration) is used and impinges on one face of the diamond plate. The temperature rise on the opposite face is measured via a fast (20 MHz), far-infrared point photo-voltaic detector. By recording the temperature rise with time, the thermal diffusivity can be calculated. Knowing the heat capacity and density of the diamond material the thermal conductivity can then be calculated from this thermal diffusivity value.

The CVD single crystal diamond material may further be grown as the second or subsequent stage of a multi-stage growth process. The stages of the multi-stage growth process may be distinguished by changes in any of the CVD reactor conditions commonly controlled during growth. Such CVD reactor conditions include, but are not limited to, the gas pressure, gas temperature, chemical composition of the gas (including the concentration of nitrogen), and the substrate temperature. These changes in CVD reactor conditions can influence the properties of the diamond deposited during each of these stages. It has been discovered by the inventors that by changing the CVD reactor conditions during growth it is possible to alter certain properties of the deposited diamond that is subsequently deposited, whilst retaining other certain properties of the previously deposited diamond. This surprising observation gives increased control over the properties of the deposited diamond in each stage of the growth process.

To further illustrate the advantage of this insight the following situation is illustrated. It is known from WO2004/046427 A1 that in order to minimise the presence of dislocations within CVD single crystal diamond it is important to have, typically, 300 parts per billion of nitrogen present in the gas used during CVD production of the diamond. This presence of nitrogen also reduces the formation of pits on the growth surface of the diamond, the reduction in dislocation density may be related to the reduced formation of these pits. The pits may also be responsible for the inclusion of other defects and impurities into the material.

Whilst adding controlled levels of nitrogen can be advantageous with regards to control of dislocations in CVD diamond, for certain applications it is desirable to reduce levels of nitrogen whilst maintaining a low dislocation density. This is the case when using CVD single crystal diamond material as the Raman scattering medium within a Raman laser. In such an application the reduced nitrogen incorporation leads generally to a lower absorption, and hence reduces absorption-related cavity losses, and reduced dislocation densities can lead to lower birefringence-related depolarisation. Thus a reduction in nitrogen and in the dislocation density in the CVD single crystal material used as the Raman scattering medium can lead to a Raman laser with a lower threshold and higher efficiency.

It has been found that it is possible to deposit a low dislocation density diamond during one stage of CVD growth and then reduce the nitrogen content of the gas used during CVD production of a subsequent stage to reduce the incorporation of nitrogen within the single crystal diamond material for that stage. Surprisingly it is found that the reduction in nitrogen content within the gas used during CVD production of the subsequent stage does not lead to a corresponding increase in pit formation and dislocation density. The CVD single crystal diamond material deposited during this subsequent stage therefore benefits from both a reduced dislocation density and reduced nitrogen incorporation. This makes this material ideal for demanding applications, such as the Raman scattering medium within a Raman laser.

The incorporation of nitrogen within the deposited diamond material can be altered by altering the concentration of nitrogen within the gas phase used during the CVD process. In particular, the incorporation of nitrogen can be reduced by reducing the nitrogen content of the gas phase within the CVD reactor. Other CVD reactor conditions may be varied to alter the incorporation of nitrogen within the diamond material being deposited.

Where parts per billion (ppb) of nitrogen and parts per million (ppm) of nitrogen in the gas phase are quoted, these are always calculated for molecular nitrogen.

The "growth surface" of the diamond corresponds to the surface onto which deposition of diamond occurs during the CVD process.

The term "dislocation" is used to refer to the family of line defects, including edge dislocations, screw dislocations, mixed dislocations and dislocations within dislocation bundles.

Incorporation of nitrogen refers to nitrogen being contained within the CVD single crystal diamond material as it grows. Such incorporated nitrogen can be atomically incorporated within the lattice, substitutionally or interstially, or as a defect complex. An incorporation rate of nitrogen refers to a measure of the amount of nitrogen incorporated for a given distance of diamond growth perpendicular to the substrate over a fixed area.

A further property that can be controlled by utilising a multi-stage growth process within CVD production of diamond is the relative growth rates in different crystallographic directions. Such relative growth rates can be characterised by a parameter, $\alpha$. The parameter $\alpha$ is defined as $$\alpha = \frac{\sqrt{3} \times R_{<001>}}{R_{<111>}}$$

where $R_{<001>}$ is the growth rate in the <001> direction and $R_{<111>}$ is the growth rate in the <111> direction. The parameter $\alpha$ can be controlled by specific CVD reactor conditions, such as the gas pressure, gas temperature, chemical composition of the gas (including nitrogen concentration) and the substrate temperature. Therefore by knowing the crystallographic orientation of the single crystal diamond that is being deposited (commonly dictated by the crystallographic orientation of the substrate) and by varying one of the CVD reactor conditions that influence $\alpha$, it is possible to exert some control over the evolution of the geometry of the diamond that is deposited. The $\alpha$ parameter for at least one of the previous stages before the production of the single crystal diamond material of interest is in the range of 1.4 to 2.6, preferably 1.6 to 2.4, preferably 1.8 to 2.2, preferably 1.9 to 2.1.

It has been found that by tailoring the CVD synthesis conditions, for example by growing CVD diamond material with a in the above mentioned preferred range, the growth rate in the [001] direction is just high enough compared with the growth rate in the <111> direction substantially to prevent the formation of {111} facets immediately below and adjacent to the main (001) growth surface, and just low enough substantially to prevent the main (001) growth surface itself becoming unstable and forming hillocks and/or other damaging features. It has been found that, all other things being equal, if $\alpha$ is above the preferred limits then {111} facets form and may twin such that the twins encroach on the main (001) growth face and thereby hinder or stop any further increase in the lateral dimensions of the grown crystal. Similarly it has been found that, all other things being equal, if $\alpha$ is below the preferred limits then lateral growth is limited and the smooth growth on the (001) surface is lost.

This control can be utilised in combination with the multi-stage growth process described earlier, wherein the nitrogen concentration in the process gas within the CVD reactor was reduced for a growth stage after the first stage of growth to give a CVD single crystal diamond material that had, advantageously, a low dislocation density and a low nitrogen content. The nitrogen content also influences the parameter $\alpha$. During at least one stage of growth prior to the stage that produces the CVD single crystal diamond material of an embodiment of the present invention, the presence of nitrogen to minimise the formation of dislocations also promotes growth along the <100> directions. Therefore when using a substrate with a major {100} growth face and {100} side faces, it is possible, when growing homoepitaxially, for the deposited diamond to grow so that the major growth face is larger than that of the substrate. When the nitrogen content of the gas within the CVD reactor is decreased, although the lateral growth rate is decreased, further deposition occurs onto this enlarged growth surface. This means that a subsequent stage that is used to deposit the CVD single crystal diamond material of an embodiment of the present invention has dimensions which are not constrained to correspond to those of the substrate. The transition from one stage to the next can be chosen to occur when the stages of growth prior to the stage of growth that produces the CVD single crystal diamond material of an embodiment of the present invention have achieved the desired increase in the growth surface area.

This ability to increase the growth surface area before depositing the CVD single crystal diamond material results in the CVD single crystal diamond material possessing a reduced dislocation density, reduced nitrogen content and an increased dimension compared to commonly available substrates. All of these are advantageous when using the single crystal diamond material as the Raman scattering medium within a Raman laser. These properties decrease the birefringence, decrease absorption and increase the path length within the CVD single crystal diamond material, decreasing the threshold power required for the material to act as a laser.

"Growth rate" refers to the rate at which the CVD single crystal diamond is synthesised (or grown), defined as the distance moved by the growth surface in a direction normal to that surface per unit time.

The crystallographic notation utilised herein is that of the well-known Miller index where {hkl} refers to a set of planes related to (hkl) by the symmetry of the crystal and <uvw> efers to a set of crystallographic directions related to [uvw] by the symmetry of the crystal.

"Homoepitaxial" when referring to the deposited diamond means it has the same crystallographic orientation as the substrate onto which it is deposited.

The "path length" within the CVD single crystal diamond material is herein defined to be the distance over which the light which is incident on the material travels within the material without being reflected. It therefore depends on the dimensions of the CVD single crystal diamond material and the relative direction of the light within the material.

During the multi-stage growth process, when using the nitrogen content of the gas within the CVD reactor to alter the deposited diamond material's properties, it has been described herein that during initial stages the nitrogen content will be relatively higher and then reduced for subsequent stages.

In at least one growth stage of the multi-stage growth process prior to the stage that produces the CVD single crystal diamond material of an embodiment of the present invention the nitrogen content in the gas within the CVD reactor is less than 5 parts per million, maybe less than 2 parts per million, maybe less than 1.5 parts per million. The nitrogen content within the CVD reactor gas is more than 300 parts per billion, preferably more than 400 parts per billion, preferably more than 500 parts per billion, preferably more than 600 parts per billion preferably more than 700 parts per billion, preferably more than 800 parts per billion, preferably more than 1000 parts per billion. The increased nitrogen content in the gas within the CVD reactor increases the inhibition of the formation of dislocations.

In at least one growth stage of the multi-stage growth process prior to the stage that produces the CVD single crystal diamond of an embodiment of the present invention the nitrogen content incorporated within the deposited single crystal diamond material, as measured by EPR, is less than $5\times10^{17}$ atoms cm$^{-3}$, maybe less than $2\times10^{17}$ atoms cm$^{-3}$. The nitrogen content incorporated within the deposited single crystal diamond material, as measured by EPR, is greater than $1\times10^{16}$ atoms cm$^{-3}$, maybe greater than $5\times10^{16}$ atoms cm$^{-3}$.

In at least one growth stage of the multi-stage growth process prior to the stage that produces the CVD single crystal diamond of an embodiment of the present invention the thickness of the deposited material is greater than 30 μm, maybe greater than 0.1 mm, maybe greater than 0.2 mm, maybe greater than 0.5 mm, maybe greater than 1 mm, maybe greater than 1.6 mm, maybe greater than 1.9 mm, maybe greater than 2 mm. The thickness of the deposited layer may be less than 20 mm, maybe less than 10 mm, maybe less than 5 mm, maybe less than 3 mm.

During the stage of growth that produces the CVD single crystal diamond material of an embodiment of the present invention the nitrogen content in the gas within the CVD reactor is less than 250 parts per billion, preferably less than 200 parts per billion, preferably less than 150 parts per billion, preferably less than 120 parts per billion. The decreased nitrogen content in the gas within the CVD reactor results in a decreased nitrogen content within the CVD single crystal diamond material, and therefore a lower absorption coefficient. The nitrogen content within the CVD reactor gas is more than 0.001 parts per billion, maybe more than 0.01 parts per billion, maybe more than 0.1 parts per billion, maybe more than 1 part per billion, maybe more than 10 parts per billion.

During the stage of growth that produces the CVD single crystal diamond material of an embodiment of the present invention the nitrogen content incorporated within the deposited single crystal diamond material, as measured by EPR, is less than $5\times10^{15}$ atoms cm$^{-3}$, preferably less than $1\times10^{15}$ atoms cm$^{-3}$, preferably less than $5\times10^{14}$ atoms cm$^{-3}$. This reducing nitrogen content advantageously decreases the absorption coefficient. The nitrogen content incorporated within the deposited single crystal diamond material, as measured by EPR, is greater than $1\times10^{10}$ atoms cm$^{-3}$, maybe greater than $1\times10^{11}$ atoms cm$^{-3}$, maybe greater than $1\times10^{12}$ atoms cm$^{-3}$, maybe greater than $1\times10^{13}$ atoms cm$^{-3}$, maybe greater than $5\times10^{13}$ atoms cm$^{-3}$.

During the stage of growth that produces the CVD single crystal diamond material of an embodiment of the present invention the thickness of the deposited material is greater than 30 μm, maybe greater than 0.1 mm, maybe greater than 0.2 mm, maybe greater than 0.5 mm, maybe greater than 1 mm, maybe greater than 1.6 mm, maybe greater than 1.9 mm, maybe greater than 2 mm. The thickness of the deposited material is less than 20 mm, maybe less than 10 mm, maybe less than 5 mm, maybe less than 3 mm.

The layer of diamond material deposited at each stage of the growth process has a thickness measured in the growth direction of between 30 μm and 20 mm. Each layer is formed maintaining consistent CVD reactor conditions. Preferably, when a change in the nitrogen incorporation within the deposited material distinguishes the deposition stages, the nitrogen levels within the diamond material are maintained within ±50% of the required nitrogen content level, preferably ±30% of the required nitrogen level, preferably ±20% of the required nitrogen level, more preferably ±10% of the required nitrogen content level.

The time taken to effect the change in the CVD reactor condition that is being changed in order to initiate a new stage of growth, i.e. the time to vary the nitrogen concentration in the CVD reactor gas from one level to another, is not important.

The layer that forms the CVD single crystal diamond material of use does not necessarily have to be the last stage, it can produced at any stage of growth following the first stage.

The term "CVD single crystal diamond material of use" refers to the CVD single crystal diamond material as defined by an embodiment of the present invention.

After the multi-stage growth process has been completed the diamond material deposited in the stages before or after the stage that deposited the CVD single crystal diamond material of use can be separated from the CVD single crystal diamond material of use by mechanical or laser sawing and then further processed into a form required for the application of interest. Alternatively, the other layers may be retained, attached to the CVD single crystal diamond material of use. The other layers may even form functional parts, such as a support for the CVD single crystal material of use. Further, the CVD single crystal diamond material of use may itself have been grown over multiple stages, producing a CVD single crystal diamond material consisting of multiple layers, providing all layers exhibit the properties required of an embodiment of the present invention.

The multi-stage growth process used to produce the CVD single crystal diamond material may consist of two stages. All embodiments described regarding the multi-stage growth process can equally apply to the two stage growth process.

The diamond deposited at the previous stages of the growth process, prior to the stage producing the CVD single crystal diamond material of use, may possess an absorption at a wavelength of 1064 nm greater than 0.010 cm$^{-1}$. This is due to the stages of growth, prior to the stage producing the CVD single crystal diamond material of use, not possessing the required properties.

The diamond deposited at the previous stages of the growth process, prior to the stage producing the CVD single crystal diamond material of use, may possess a longest linear internal dimension less than 7 mm. This is again due to the stages of growth, prior to the stage producing the CVD single crystal diamond material of use, not possessing the required properties.

The lower birefringence, lower absorption and increased dimensions of the CVD single crystal diamond material make it ideal for use in optical applications.

The CVD single crystal diamond material may be used in a Raman laser. Specifically it may be used as the Raman scattering medium within the Raman laser. The Raman laser setup may take one of the forms already described herein.

The pumping light beam of the Raman laser may be incident on the CVD single crystal diamond material, acting as the Raman scattering medium, such that the pumping light beam is substantially perpendicular to the direction of the at least one dislocation's dislocation line within the CVD single crystal diamond material. This has the advantage that the birefringence caused by the presence of a dislocation within the CVD single crystal diamond material is less when the incident light beam travels perpendicular to the dislocation line of the dislocation, compared to when the incident light beam travels parallel to the dislocation line. By directing the incident light beam in a direction perpendicular to the dislocation lines, the birefringence is reduced, which leads to low birefringence related polarisation losses. Further, the light beam of the Raman laser may be substantially parallel to the at least one dislocation's dislocation line.

The dislocation line of a dislocation is the line that extends along the end of the extra half-plane of atoms for an edge dislocation, and along the centre of the spiral of a screw dislocation.

When referring to the light beam being "substantially perpendicular" to the dislocation line, this means within 20° of perpendicular, preferably within 10° of perpendicular, preferably within 5°, preferably within 2°. Dislocation lines are typically substantially parallel to the growth direction (perpendicular to the growth surface) in a single crystal diamond material produced by the CVD method, described by Friel et al. Diamond & Related Materials 18 (2009) 808-815. "Substantially parallel" means within 20° of perpendicular, preferably within 10° of perpendicular to the growth surface, preferably within 5°, preferably within 2°.

The single crystal diamond material used may contain a plurality of dislocations which are oriented substantially parallel to each other and substantially parallel to the growth direction. The light beam can then be oriented to be substantially perpendicular to this plurality of dislocations' lines. When considering a plurality of dislocations it is considered that less than 20% will not lie substantially parallel to the growth direction, preferably less than 10%, preferably less than 5%, preferably less than 2%, preferably less than 1%.

A Raman laser comprising the CVD single crystal diamond material of the present invention as a Raman scattering medium will possess a greater efficiency than a Raman laser utilising an alternative material as the Raman scattering medium. This is due to diamond possessing a greater Raman gain coefficient than other candidate materials for use in a Raman laser, and a high thermal conductivity. A comparison of relevant properties for candidate materials for use as the Raman scattering medium in a Raman laser is given in Table 1. The superior Raman gain coefficient (at a defined wavelength of incident light of 1.064 μm and at room temperature) and thermal conductivity properties of diamond are clearly evident.

A further benefit of using diamond in optical applications, and as the Raman scattering medium within a Raman laser can be seen from the spectral transparency ranges given in Table 1. Diamond is optically transparent to a wider range of the electromagnetic spectrum than other candidate materials. This allows versatility in the choice of input, intermediate and output frequencies of light to be utilised in Raman laser and other applications.

A dimensionless thermal figure of merit can be used to aid comparison of the different materials. The thermal figure of merit, FoM, is defined as $$FoM = \left| \frac{k g_R L}{(dn/dT) \Delta \lambda} \right|$$

where k is the thermal conductivity of the material, $g_R$ is the Raman gain coefficient of the material, L is the crystal length, $\Delta \lambda$ is the Raman wavelength shift of the material and dn/dT is the rate of change of refractive index with temperature. Assuming a crystal length of 6 mm for diamond and 25 mm for all other materials, it can be seen that diamond has the highest thermal figure of merit. Being able to increase this thermal figure of merit for diamond would represent a further increase in performance of the diamond material when used in Raman laser applications. Such an increase can be achieved by increasing the Raman gain coefficient, increasing the thermal conductivity or increasing the crystal length.

The crystal length is the optical path length in the crystal, the length over which an incident beam travels within the material.

For the CVD single crystal diamond material the thermal figure of merit, at 1.064 μm and room temperature, may be greater than 600, preferably greater than 1000, preferably greater than 2000, preferably greater than 3000, preferably greater than 4000. For the CVD single crystal diamond material the thermal figure of merit, at 1.064 μm, may be less than 12000.

TABLE 1

| | Material | | | |
|---|---|---|---|---|
| | Diamond | KGW | YVO$_4$ | Ba(NO$_3$)$_2$ |
| Raman gain coefficient, $g_R$ (cm GW$^{-1}$), values given are at a pump wavelength of 1.064 μm and room temperature | ~15 | ~4 | 5 | 11 |
| Raman Shift (cm$^{-1}$) | 1332 | 901 | 892 | 1047 |
| Thermal Conductivity, k (W m$^{-1}$ K$^{-1}$) at room temp | 2000 | ~3 | 5.2 | 1.2 |
| crystal length, L (mm) | 6 | 25 | 25 | 25 |
| dn/dT (×10$^{-6}$ K$^{-1}$ at room temp) | 10 | −1 to −5 | 3 | −20 |
| Thermal Figure of Merit at a pump wavelength of 1.064 μm and room temp | 1025 | 3 | 20 | 1 |
| Spectral transparency range (μm) | 0.23 to 100 | 0.3 to 5 | 0.4 to 5 | 0.3 to 1.8 |

The intrinsically high $g_R$ and wide spectral transparency of diamond compared to other Raman gain materials, as shown by Table 1, opens up the possibility of producing a diamond Raman laser which can produce output at wavelengths substantially greater than 1 micron, where there is currently a dearth of solid state laser sources.

A Raman laser with the CVD single crystal diamond material of the present invention as the Raman scattering medium may produce light with a wavelength of below 500 μm.

A Raman laser with the CVD single crystal diamond material of the present invention as the Raman scattering medium may produce light with a wavelength greater than 1 μm, alternatively greater than 5 μm, alternatively greater than 10 μm, alternatively greater than 50 μm, alternatively greater than 100 μm.

A Raman laser with the CVD single crystal diamond material of the present invention as the Raman scattering medium of the Raman laser may further comprise a pumping light source, wherein the pumping light source produces a pumping light beam having a wavelength that is different to an output light beam of the laser by one or more Stokes shifts of the Raman scattering medium. The utilisation of Stokes Raman scattering to convert the frequency of the pumping light beam to give an output beam means that it is possible to change the frequency by one Stokes shift of the Raman scattering medium. It is also possible for Stokes Raman scattered photons to undergo further Stokes Raman scattering and so produce photons possessing a frequency that is different from the pumping light beam by multiple Stokes shifts. It is also possible to convert the frequency of the Stokes scattered photons by other alternative methods to produce an output beam with a different frequency. Utilising other methods means that the term "one or more Stokes shifts" is not limited to an integer number of Stokes shifts.

The frequency conversion process that occurs within a Raman laser comprising the CVD single crystal material can be highly efficient and has the additional benefit of providing improved beam quality via beam clean-up: for a pump beam with higher-order transverse modes, the non-linear nature of SRS ensures that usually only the high intensity fundamental mode is frequency converted. Similarly, in pulsed mode operation, frequency conversion only occurs in temporal regions at which the threshold is exceeded, leading to pulse shortening. In a similar manner a pump beam which is not purely monochromatic, but possesses a finite spectral width, can be converted to a Stokes beam with a narrower spectral width. Thus diamond Raman lasers offer the potential for enhanced spatial, temporal and spectral beam properties. In addition to these benefits in beam quality enhancement, there are no special techniques required for phase matching of the incident and Stokes beams (such as angular adjustments of the crystal), unlike in other nonlinear processes, as the momentum mismatch is taken up by the excited optical phonon. This means that pumping can, in principle, be from any angle or any range of angles.

The beam clean up process results in an output light beam of a higher laser beam quality. Laser beam quality is a measure of how tightly a laser beam can be focused. A standard parameter used widely to define beam quality is the $M^2$ factor:

$$M^2 = \frac{\pi W_0 \theta}{\lambda}$$

where $\lambda$ is the laser beam wavelength, $\theta$ is the half angle beam divergence in the far field and $W_0$ is the beam radius at the beam waist, these quantities being understood to those skilled in the art. For a diffraction-limited Gaussian beam it is well known that the product of $W_0$ and $\theta$ is equal to $\lambda/\pi$ (e.g. Ref: B. E. A. Saleh & M. C. Teich, *Fundamentals of Photonics*, Wiley 1991, Ch. 3) such that $M^2$ equals unity, and this is the minimum value of $M^2$ achievable. For a laser system with a non-Gaussian beam output $M^2$ will be greater than unity. The closer the value of $M^2$ is to unity, the higher the beam quality.

High laser output beam quality is a generally desirable property and is influenced by a number of factors. Factors external to the laser gain medium include the pump beam quality, resonator design and the quality of optical components used in the laser system (such as the mirrors). Factors intrinsic to the laser gain medium which enhance output beam quality include the ability to clean up the pump beam, as already described, and a gain material which exhibits minimal thermal lensing. Diamond Raman lasers therefore excel at producing Stokes output beams of high beam quality.

$M^2$ can be measured according to an ISO standard technique (ISO Standard 11146, "Lasers and laser-related equipment—Test methods for laser beam widths, divergence angles and beam propagation ratios" (2005)), in which the evolution of the beam radius along the direction of beam propagation is measured and analysed. Such a measurement can be performed using widely available commercial beam profilers.

The $M^2$ factor of the output light beam from the Raman laser comprising the CVD single crystal material of the present invention is less than 10.0, preferably less than 5.0, preferably less than 2.0, preferably less than 1.5, preferably less than 1.1. The decreased $M^2$ factor represents an increased laser beam quality. This increased laser beam quality results in a laser with a lower divergence of the laser beam which is of use in laser applications.

A method is also provided for producing a CVD single crystal diamond material with the properties defined in claim 1. Such a method may consist of multiple growth stages wherein the multiple growth stages consist of at least 2 stages. Each of these stages can be distinguished by a change in a CVD reactor condition as described earlier. One such change is the incorporation rate of nitrogen, which in turn can be affected by changing the concentration of nitrogen in the process gas within the CVD reactor. In particular it is favourable to decrease the incorporation rate of nitrogen within the CVD single crystal diamond material for the stage of growth that produces the CVD single crystal diamond material of an embodiment of the present invention. This can be achieved by decreasing the concentration of nitrogen in the process gas within the CVD reactor for the stage of growth that produces the CVD single crystal diamond material of an embodiment of the present invention, preferably to within the limits discussed herein. The CVD single crystal diamond material desired may be produced in the final stage of growth of the multi-stage growth process or it may produced during any stage of growth after the first stage of growth.

A further method is provided to produce a CVD single crystal diamond within a CVD reactor using a gas phase with multiple growth stages, at least two of the multiple growth stages being distinguished by changing the nitrogen concentration in the gas phase within the CVD reactor, at least one of the at least two growth stages having a nitrogen concentration within the gas phase of greater than or equal to 300 parts per billion (preferably greater than 400 parts per billion, preferably greater than 500 parts per billion, preferably greater than 600 parts per billion, preferably greater than 700 parts per billion, preferably greater than 800 parts per billion, preferably greater than 1000 parts per billion) and less than 5 parts per million (maybe less than 2 parts per million, maybe less than 1.5 parts per million), calculated as molecular nitrogen, and at least one other of the at least two growth stages having a nitrogen concentration within the gas phase of greater than 0.001 parts per billion (maybe greater than 0.01 parts per billion, maybe greater than 0.1 parts per billion, maybe greater than 1 parts per billion, maybe greater than 10 parts per billion) and less than 250 parts per billion (preferably less than 200 parts per billion, preferably less than 150 parts per billion, preferably less than 120 parts per billion), calculated as molecular nitrogen.

EXAMPLES

An exemplary embodiment of the present invention will now be described.

Example 1

A synthetic type 1b HPHT diamond plate with a pair of approximately parallel major faces within ~5° of (001) was selected. The plate was fabricated into a square substrate suitable for homoepitaxial synthesis of single crystal CVD diamond material by a process including the following steps:

i) laser cutting of the substrate to produce a plate with all <100> edges;

ii) lapping and polishing the major surface upon which growth is to occur, the lapped and polished part having dimensions about 6.0 mm×6.0 mm by 400 μm thick, with all faces {100}. The defect level at or below the substrate surface is minimised by careful preparation of the substrate as disclosed in EP 1 292 726 and EP 1 290 251. It is possible to reveal the defect levels being introduced by this processing by using a revealing plasma etch. It is possible routinely to produce substrates in which the density of defects measurable after a revealing etch is dependent primarily on the material quality and is below $5 \times 10^3$ mm$^{-2}$, and generally below $10^2$ mm$^{-2}$. The surface roughness at this stage was less than 10 nm over a measured area of at least 50 μm×50 μm. The substrate was mounted on to a substrate carrier using a high temperature diamond material braze. The substrate and its carrier were then introduced into a CVD reactor chamber and an etch and growth cycle commenced by feeding gasses into the chamber as follows:

First, an in situ oxygen plasma etch was performed at a pressure of 230 Torr and a substrate temperature of 787° C., followed by a hydrogen etch, oxygen being removed from the gas flow at this stage. Then the first stage growth process was started by the addition of methane at 22 sccm (standard cubic centimeter per second). Nitrogen was added to achieve a level of 800 ppb in the gas phase. Hydrogen was also present in the process gas. The substrate temperature at this stage was 827° C. Over the subsequent 24 hours the methane content was increased to 30 sccm. These growth conditions were selected to give an α parameter value in the range of 2.0±0.2, based on previous test runs and confirmed retrospectively by crystallographic examination.

After the stage 1 growth layer reached a thickness of 2.5 mm, the stage 2 growth was commenced by reducing the nitrogen present in the gas phase to a level of 150 ppb in the gas phase. Growth was terminated after the stage 2 growth layer reached a thickness of 1.7 mm.

Study of the grown CVD diamond plate revealed that it was free of twins and cracks on the (001) face, and bounded by <110> sides and post-synthesis dimensions of the twin free top (001) face were increased to 8.7 mm×8.7 mm. Examination of the as-grown surface of the crystal under an optical microscope revealed a complete absence of surface pits.

Figure 4:
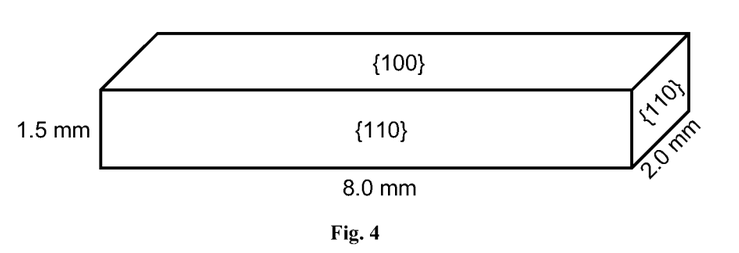
FIG. 4 depicts the dimensions and orientation of the CVD single crystal diamond material produced by Example 1.

The stage two layer was separated from the stage one and substrate layers by laser sawing, and further processed by lapping and polishing to produce a rectangular plate of size 8.0 mm×2.0 mm×1.5 mm, with two opposite pairs of {110} faces and one opposite pair of {100} faces (FIG. 4).

Opposite pairs of faces were polished parallel to within 0.06°. The average birefringence along an optical path normal to one of the {110} faces of size 1.5 mm×2.0 mm, as measured by Metripol at 550 nm, was less than $2 \times 10^{-6}$. The absorption coefficient of the material was measured by laser calorimetry to be 0.007 cm$^{-1}$ at 1064 nm. The dislocation density was measured by X-ray topography to be $2 \times 10^3$ dislocations cm$^{-2}$. The optical phonon decoherence time measured by TCUPS was 8 ps. The concentration of single-substitutional nitrogen in the neutral charge state was measured by EPR to be $3.5 \times 10^{15}$ atoms cm$^{-3}$. The thermal conductivity was measured by laser flash calorimetry to be 2050 W m$^{-1}$ K$^{-1}$.

Figure 5:
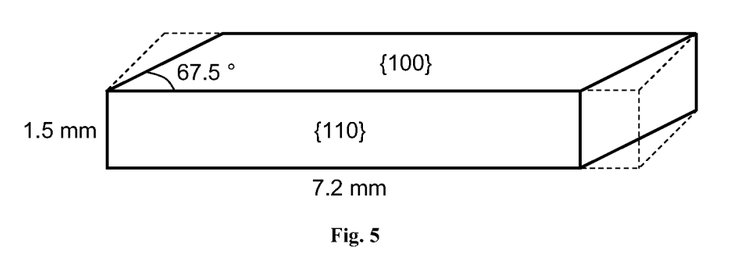
FIG. 5 depicts the CVD single crystal diamond material of FIG. 4 that has been faceted for use in a Raman laser.
Figures 6, 7:
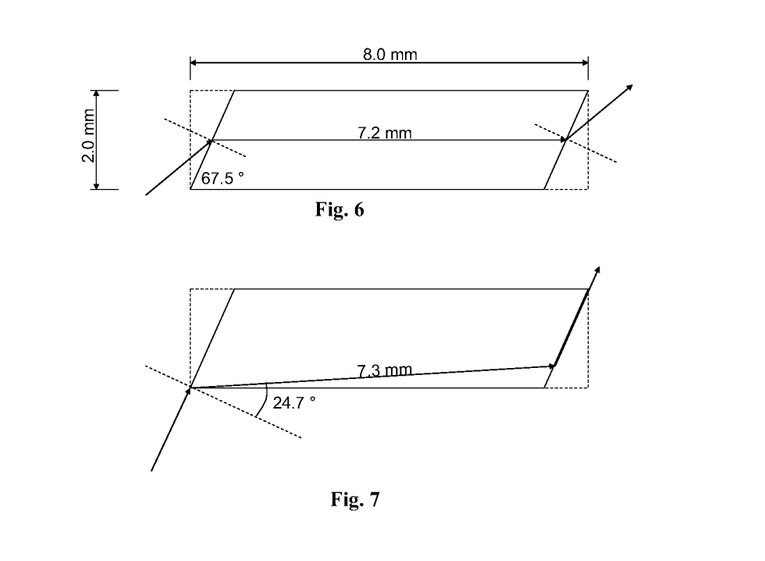
FIG. 6 depicts the CVD single crystal diamond material of FIG. 5, indicating the calculated path length for use in a laser application.
FIG. 7 depicts the CVD single crystal diamond material of FIG. 5, indicating the longest optically accessible dimension.

Brewster facets of angle 67.5° were polished on the {110} faces of size 1.5 mm×2.0 mm (FIG. 5) for propagation of the pump and Stokes beams along the <110> direction parallel to the longest crystal dimension, giving a path length of 7.2 mm (FIG. 6). The longest linear optically accessible dimension can be calculated by considering light beam incident on the facet at an angle of 90° to the facet normal (such a situation would be difficult to achieve in practice but gives the maximum optically accessible dimension). This light beam will be refracted so that it propagates within the crystal at the critical angle to the normal of the facet on which it was incident. The longest optically accessible dimension can then be calculated by trigonometry to be 7.3 mm (FIG. 7), assuming the crystal is surrounded by air with a refractive index of 1. The diamond crystal was mounted on a thermo-electric cooled mount and placed inside an optical resonator consisting of an input coupler (94.2% transmitting at 532 nm; highly reflecting at 560-650 nm) and output coupler (highly reflecting at 532 nm, 25% transmitting at 573 nm and 80% transmitting at 620 nm). Both of these mirror couplers had a radius of curvature of 20 cm. The output coupler retroreflects the pump to provide a second pass of the Raman crystal.

The diamond Raman resonator was pumped externally by a q-switched Nd:YAG laser of pulse duration 8 ns, operating at a pulse repetition frequency of 5 kHz, and frequency doubled from 1064 to 532 nm. The p-polarized pump beam was incident on one of the Brewster facets at the Brewster angle, thus ensuring <110> polarized pump and Stokes beams propagating along <110> within the diamond crystal. A harmonic separator placed in the pump beam path ensured no residual fundamental pump light at 1064 nm reached the Raman resonator. The pump beam was focused into the crystal using a 10 cm focal length lens.

Pump to Stokes conversion efficiency was investigated for input powers up to approximately 2.2 W, which corresponded to 0.44 mJ pulse energies. Input and output energies were measured using a calibrated energy meter. Output energy was measured as a function of input energy, yielding a threshold for Raman lasing of around 0.08 mJ, and a slope efficiency of conversion from pump to Stokes light of 78%.

What is claimed is:

1. A CVD single crystal diamond material wherein the diamond material has the following characteristics, when measured at room temperature: a longest linear internal dimension greater than 7 mm, a birefringence of below $1 \times 10^{-5}$ determined using a light beam with a cross-sectional area greater than 0.01 mm$^2$ and along an internal path greater than 7 mm and an absorption coefficient below 0.010 cm$^{-1}$ determined at a wavelength of 1064 nm.

2. The CVD single crystal diamond material of claim 1, wherein the CVD single crystal diamond material has a longest linear optically accessible dimension of greater than 7 mm.

3. The CVD single crystal diamond material of claim 1, wherein the CVD single crystal diamond material has a property $T_2$, and $T_2$, measured at room temperature, is determined to be greater than 4 ps.

4. The CVD single crystal diamond material of claim 1, wherein the CVD single crystal diamond material contains single-substitutional nitrogen in the neutral charge state, wherein the single-substitutional nitrogen in the neutral charge state content within the CVD single crystal diamond material measured by EPR is less than or equal to $5\times10^{15}$ atoms $cm^{-3}$.

5. The CVD single crystal diamond material of claim 1, wherein the CVD single crystal diamond material contains dislocations, wherein the dislocation density is below $10^4$ dislocations $cm^{-2}$.

6. The CVD single crystal diamond material of claim 1, wherein the CVD single crystal diamond material exhibits a thermal conductivity, the thermal conductivity, measured at room temperature, being greater than 2000 $Wm^{-1}K^{-1}$.

7. The CVD single crystal diamond material of claim 1, wherein the CVD single crystal diamond material is grown as a second or subsequent stage in a multi-stage growth process.

8. The CVD single crystal diamond material of claim 7 wherein the multi-stage growth process consists of two stages.

9. The CVD single crystal diamond material of claim 7, wherein the diamond grown during at least one of the previous stages prior to the stage in which the CVD single crystal diamond material of claim 1 is grown possesses an absorption at a wavelength of 1064 nm greater than 0.010 $cm^{-1}$.

10. The CVD single crystal diamond material of claim 7, wherein the diamond grown during at least one of the previous stages prior to the stage in which the CVD single crystal diamond material of claim 1 is grown possesses a longest linear internal dimension less than 7 mm.

11. The CVD single crystal diamond material of any of claim 7, wherein the diamond grown during at least one of the previous stages prior to the stage in which the CVD single crystal diamond material of claim 1 is grown contains single substitutional nitrogen in the neutral charge state, the single substitutional nitrogen in the neutral charge state content within one of the previous stages measured by EPR being greater than $1\times10^{16}$ atoms $cm^{-3}$.

12. A Raman laser containing a Raman scattering medium comprising a CVD single crystal diamond material, wherein the diamond material has the following characteristics, when measured at room temperature: a longest linear internal dimension greater than 7 mm, a birefringence of below $1\times10^{-5}$ determined using a light beam with a cross-sectional area greater than 0.01 $mm^2$ and along an internal path greater than 7 mm and an absorption coefficient below 0.010 $cm^{-1}$ determined at a wavelength of 1064 nm.

13. The Raman laser of claim 12 further comprising a pumping light source, wherein the pumping light source produces a pumping light beam having a wavelength that is different to an output light beam of the laser by one or more Stokes shifts of the Raman scattering medium.

14. The Raman laser of claim 13, wherein the output light beam has a beam quality defined by a $M^2$ factor, the $M^2$ factor of the output light beam being less than 10.0.

15. The Raman laser of claim 12, wherein the CVD single crystal diamond material exhibits a thermal figure of merit, the thermal figure of merit being at 1.064 μm being greater than 600.

16. A method of producing a CVD single crystal diamond within a CVD reactor using a gas phase with multiple growth stages, at least two of the multiple growth stages being distinguished by changing the nitrogen concentration in the gas phase within the CVD reactor, at least one of the at least two growth stages having a nitrogen concentration within the gas phase of greater than or equal to 300 parts per billion and less than 5 parts per million, calculated as molecular nitrogen, and at least one other of the at least two growth stages having a nitrogen concentration within the gas phase of greater than 0.001 parts per billion and less than 250 parts per billion, calculated as molecular nitrogen, wherein the diamond material has the following characteristics, when measured at room temperature: a longest linear internal dimension greater than 7 mm, a birefringence of below $1\times10^{-5}$ determined using a light beam with a cross-sectional area greater than 0.01 $mm^2$ and along an internal path greater than 7 mm and an absorption coefficient below 0.010 $cm^{-1}$ determined at a wavelength of 1064 nm.

17. The method of claim 16, wherein the multiple growth stages consist of two stages.

18. A method of producing the CVD single crystal diamond of claim 1 wherein the CVD technique includes multiple growth stages.

19. The method of claim 18 wherein the CVD single crystal diamond material of claim 1 is produced in a stage of growth after the first stage of growth.

20. The method of claim 18, wherein the CVD technique utilises a gas phase, the gas phase containing nitrogen which is incorporated into the growing diamond material, the stages of the growth process being distinguished by a change in the incorporation rate of nitrogen within the deposited diamond.

21. The method of claim 20 wherein the incorporation rate of nitrogen is decreased relative to at least one of the earlier growth stages for the growth stage that produces the CVD single crystal diamond of claim 1.

22. The method of claim 20 wherein the incorporation rate of nitrogen is altered by changing the concentration of nitrogen in the process gas.

23. The method of claim 22 wherein the incorporation of nitrogen is decreased by decreasing the concentration of nitrogen in the process gas.

24. The method of claim 22, wherein the nitrogen concentration within the gas phase is between 300 parts per billion and 5 parts per million, calculated as molecular nitrogen, during at least one stage of growth prior to a final stage of growth.

25. The method of claim 24, wherein the nitrogen concentration is between 0.001 parts per billion and 250 parts per billion, calculated as molecular nitrogen, during a subsequent growth stage.

* * * * *